United States Patent [19]
Schreck

[11] Patent Number: 5,124,945
[45] Date of Patent: Jun. 23, 1992

[54] METHOD AND APPARATUS FOR VERIFYING THE STATE OF A PLURALITY OF ELECTRICALLY PROGRAMMABLE MEMORY CELLS

[75] Inventor: John F. Schreck, Houston, Tex.

[73] Assignee: Texas Instruments Incorporated, Dallas, Tex.

[21] Appl. No.: 737,830

[22] Filed: Jul. 29, 1991

Related U.S. Application Data

[63] Continuation of Ser. No. 450,713, Dec. 14, 1989, abandoned.

[51] Int. Cl.$^5$ .............................................. G11C 11/40
[52] U.S. Cl. .............................. 365/185; 365/189.07; 365/201
[58] Field of Search ..................... 365/185, 201, 189.07

[56] References Cited

U.S. PATENT DOCUMENTS

| | | | |
|---|---|---|---|
| 4,021,781 | 5/1977 | Caudel | 340/172 |
| 4,281,397 | 7/1981 | Neal et al. | 365/189 |
| 4,301,518 | 11/1981 | Klaas | 365/185 |
| 4,460,982 | 7/1984 | Gee et al. | 365/201 |
| 4,723,225 | 2/1988 | Kaszubinski et al. | 365/185 |
| 4,868,790 | 9/1989 | Wilmoth et al. | 365/185 |
| 4,870,618 | 9/1989 | Inashita | 365/201 |
| 4,879,689 | 11/1989 | Atsumi et al. | 365/201 |
| 4,937,787 | 6/1990 | Kobatake | 365/185 |

OTHER PUBLICATIONS

Ashmore et al., "A 20ns 1 Mb CMOS Burst Mode EEPROM" ISSCC 89, 02/15/89 pp. 40,41.

Primary Examiner—Joseph E. Clawson, Jr.
Attorney, Agent, or Firm—W. James Brady, III; Lawrence J. Bassuk; Richard L. Donaldson

[57] ABSTRACT

Apparatus for verifying the state of a plurality of electrically programmable memory cells (30-70) includes first and second memory cells (36, 38) each having current paths with first and second ends. A memory cell state sense node (BL2) is coupled to the first ends. A first array source node (82) is coupled to a second end of the current path of the first cell (36). A second array source node (84) is coupled to a second end of the current path of the second cell (38). First circuitry (160-198) is provided for sensing a program verify state (DATA, WE). Decoded ground circuitry (150, 144, 142) couples a selected one of the first and second array source nodes (140) to a low voltage source (Vss) in response to the first circuitry sensing a program verify state (DATA, WE). Second circuitry (130, 138, 134) selectively isolates at least a nonselected one of the first and second array source nodes (82, 84) from the voltage bias source in response to the first circuitry (160-198) sensing a program verify state (DATA, WE).

37 Claims, 4 Drawing Sheets

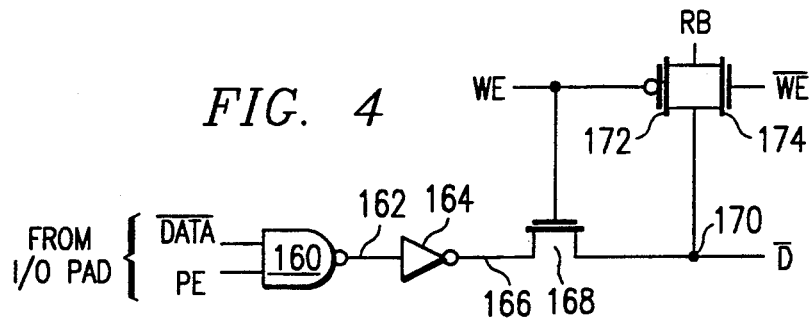
FIG. 4
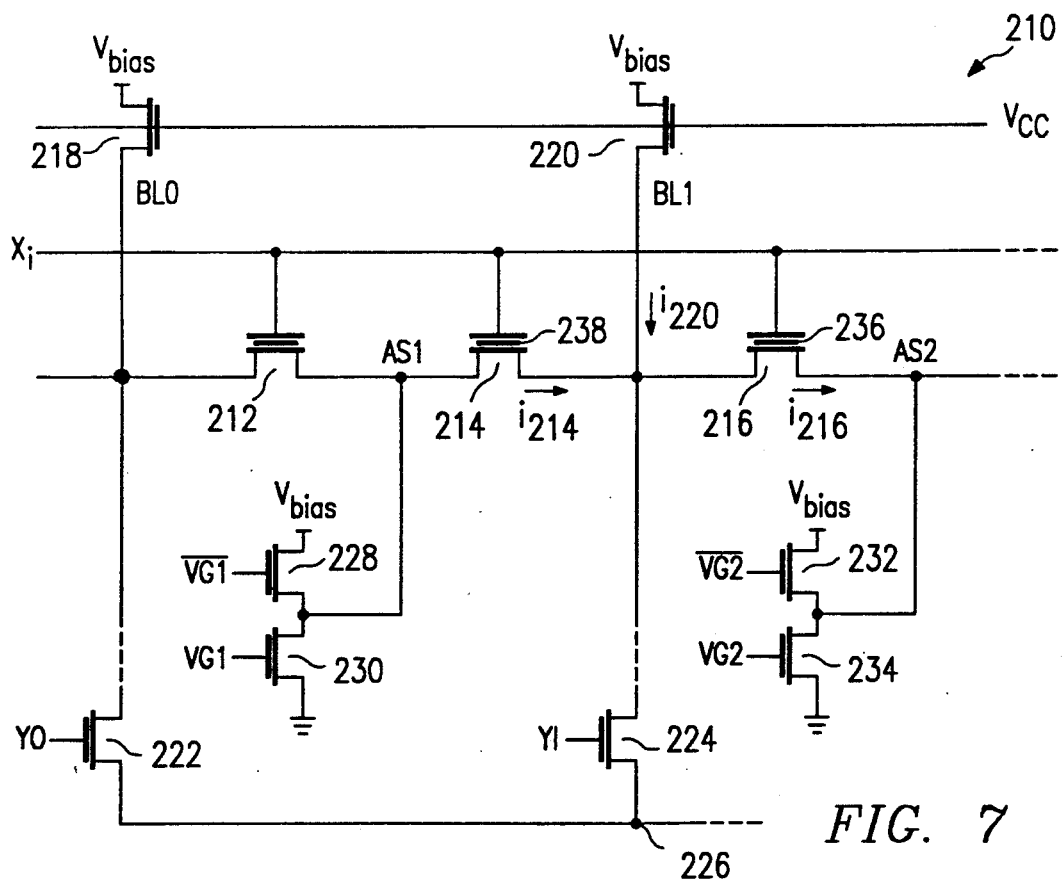
FIG. 5
FIG. 6
FIG. 7

METHOD AND APPARATUS FOR VERIFYING THE STATE OF A PLURALITY OF ELECTRICALLY PROGRAMMABLE MEMORY CELLS

This application is a continuation of application Ser. No. 07/450,713, filed Dec. 14, 1989 now abandoned.

TECHNICAL FIELD OF THE INVENTION

The present invention relates in general to programmable memory cells, and more particularly to methods and apparatus for verifying the state of a plurality of electrically programmable memory cells.

BACKGROUND OF THE INVENTION

Many conventional electrically programmable read only memory (EPROM) cell arrays are of the virtual-ground design. Adjacent columns of the memory cells share a bit line such that first ends of the current paths of an adjacent pair of cells on any one row are connected to one bit line. The other ends of the current paths of the cells are connected to different array source or decoded ground lines.

In order to read a cell, an array source or decoded ground on one end of a current path of a selected memory cell is brought low. The bit line is connected to a voltage bias source. Since the current path of the memory cell is interposed between the bit line and the selected array source, its conductance state may be ascertained by sensing the voltage level of the bit line. If the voltage level on the bit line falls, it is a sign that the state of the selected cell is conductive, and a logic "1" is read out. If the voltage level on the bit line remains high, the selected memory cell is sensed as nonconductive and a "0" is read out.

As will be described in more detail below, a cell is rendered conductive or not by the selective placement of charge on its floating gate. The more charge appears on a floating gate, the less conductive the cell is made. As more charge becomes resident on the floating gate, a higher and higher read voltage on the control gate of the cell needs to be applied in order to render the current path of the selected cell conductive. A cell may be tested to determine if sufficient charge has been placed on its floating gate by applying a predetermined test voltage, equivalent to voltage supply level plus a guard band, to the control gate and then reading the cell.

In order to increase reading speed, the virtual or decoded ground for every nonselected cell is connected to a voltage bias source. Because of this, a significant contribution of the current passing through the current path of the selected cell also passes through the current path of an adjacent yet-to-be programmed cell from an array source, which is in turn connected to the voltage bias source. As will be explained in more detail below, this current contribution will often times cause the misreading of the selected cell as being in a nonconductive or "0" state. Programming the adjacent cell from which the current contribution came will then cause the selected cell to be read as the "1" in normal operation, causing an error.

For the foregoing reasons, a need has arisen to develop methods and apparatus for correctly ascertaining the state of a memory cell during a program verify mode of the array.

SUMMARY OF THE INVENTION

The invention provides methods and apparatus for verifying the state of a plurality of electrically programmable memory cells. In one aspect of the invention, first and second memory cells have current paths each with first and second ends. A memory cell state sense node is coupled to the first ends. A first array source node is coupled to a second end of the current path of the first cell, while a second array source node is coupled to the second end of the current path of the second cell. First circuitry is provided for sensing a program verify state. Decoded ground circuitry and second circuitry are coupled to this first circuitry. In response to the first circuitry sensing a program verify state, the decoded ground circuitry couples a selected one of the first and second array source nodes to a low voltage source. The second circuitry, in response to the first circuitry sensing this program verify state, selectively isolates at least a nonselected one of the first and second array source nodes. In this manner, the current contribution from a cell adjacent to a selected cell may be eliminated, thus avoiding false verifications of a zero state in the selected cell during a program verify mode.

BRIEF DESCRIPTION OF THE DRAWINGS

Further aspects of the invention may be discerned by referring to the following detailed description when taken in conjunction with the drawings in which like characters identify like parts wherever possible, and in which:

FIG. 4 is an electrical schematic diagram of a peripheral circuit for originating a $\overline{D}$ signal used in the AS driver illustrated in FIG. 3;

FIG. 5 is an electric circuit diagram of a peripheral circuit for generating a VCCRB signal as used in the AS circuit driver shown in FIG. 3;

FIG. 6 is a detailed electric circuit diagram of a peripheral circuit for generating a SAT signal as used in the AS driver circuit illustrated in FIG. 3;

FIG. 7 is a schematic electric circuit diagram of a small section of an alternative cell array for use with the invention.

DETAILED DESCRIPTION OF THE INVENTION

Figure 1:
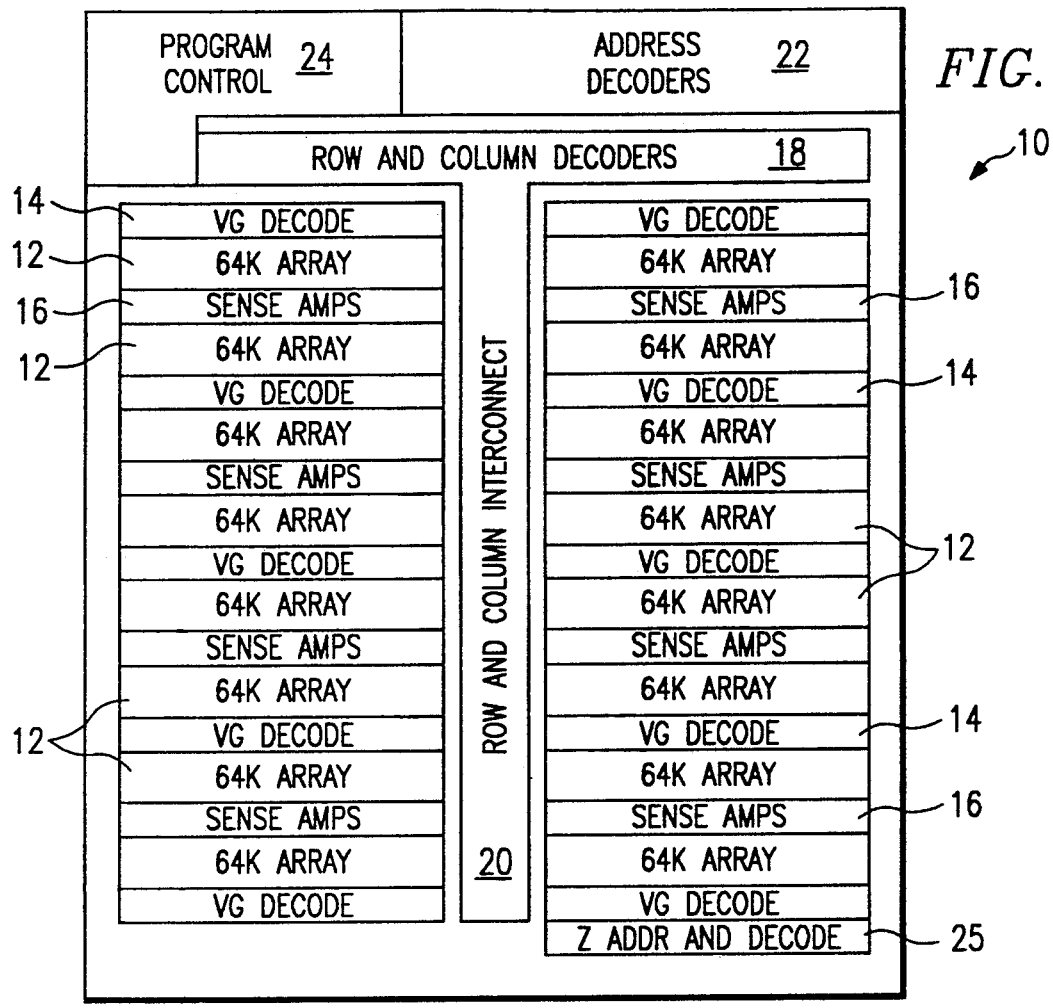
FIG. 1 is a high level schematic block diagram of a one megabit electrically programmable read only memory showing an approximate geographical location of cell arrays and circuit blocks on a chip.

FIG. 1 is a high level schematic block diagram showing central portions of a chip on which a one megabit complementary metal oxide semiconductor, electrically programmable read only memory array is fabricated. This one megabit array is indicated generally at 10. Array 10 is organized into sixteen 64 K array sections 12. Located between pairs of array sections 12 are virtual ground decode section 14 and sense amplifier section 16 Each sense amplifier section 16 contains 32 sense amplifiers, 16 for each adjacent array section.

In the illustrated embodiment, the array sections 12, together with their corresponding virtual ground decoder sections 14 and sense amplifier sections 16, are organized in a higher-order array of two columns and eight rows. A row and column decoder section 18 is situated at the top of this higher-order array, and is connected to the respective array sections 12, virtual ground decoder sections 14 and sense amplifier sections 16 through a row and column interconnect section 20. An address decoder section 22 has outputs that connect to the adjacent row and column decoder section 18. A program control block 24 is situated in the illustrated embodiment in the upper left hand corner of the chip. In the illustrated embodiment, a Z address and decoder section 25 is spatially separated from address decoder section 22 and is located in the lower right hand corner of the die 10.

Figure 2:
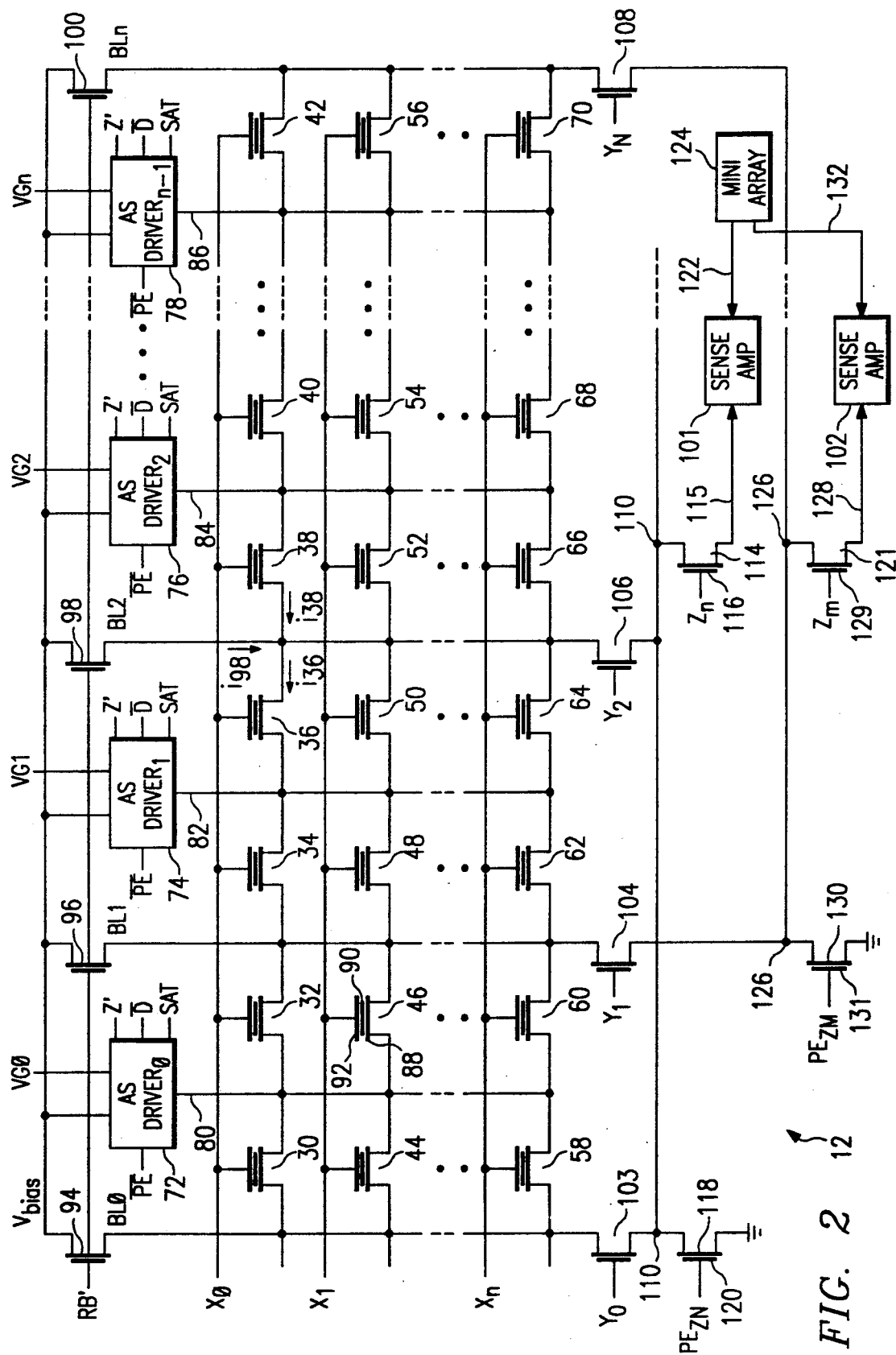
FIG. 2 is a schematic electrical circuit diagram of a small section of one of the cell arrays and associated circuitry shown in FIG. 1.

FIG. 2 is a more detailed electrical schematic diagram of a portion of one of the 64 K arrays 12. Shown are a plurality of electrically programmable read-only memory cells 30-70 which are arranged in a plurality of rows and in a plurality of columns orthogonal to the rows. Each row of cells has associated therewith a row or word line X0, X1 . . . Xn. Each pair of columns of cells has associated therewith a bit line such as BL1, BL2 . . . BLn-1. Outside bit lines BL0 and BLn are each associated with only one column of memory cells. Pairs of columns of cells also have associated therewith a respective AS (array source) driver circuit 72-78. Each AS driver circuit 72-78 is connected to a respective decoded or virtual ground signal source VG0, VG1 . . . VGn and further to a bias voltage source $V_{bias}$ which for example may be 1.7 volts. Each AS driver circuit 72-78 has as an output a respective AS driver line 80-86 that is connected to the current path of each cell in a pair of columns of cells. The memory cells 30-70 are constructed to be substantially uniform. Using as an example memory cell 46, each memory cell has a current path 88, a floating gate 90 and a control gate 92. The current path of each memory cell is connected between an AS driver line and an associated bit line. For example, cell 46 has a current path 88 that is connected between the AS driver line 80 and the bit line BL1. The control gate of each memory cell is connected to an associated word line for the row. Using cell 46 again as an example, the control gate 92 thereof is connected to word line X1.

The voltage source $v_{bias}$ is connected to the respective bit lines BL0, BL1, BL2 . . . BLn through respective n-channel field effect transistors 94–100. The gates of transistors 94–100 are connected to a read bias voltage supply signal, RB'. Signal RB' is derived from a read bias signal RB (later described) and preferably is about 0.1 volt lower than RB. RB is used within sense amplifiers 101 and 102. The voltage difference between the two signals keeps the bit lines from floating and prevents any interference in the sensing operation, as there will be less current contribution.

Respective n-channel field effect decoding transistors 103–108 have current paths which terminate ends of bit lines BL0, BL1, BL2, . . . BLn, which ends are opposed to transistors 94–100. The transistors 103–108 have gates which are respectively connected to Y-decoding signal Y0, Y1, Y2 . . . Yn.

The current paths of even transistors 103, and 106, etc. selectively connect their respective bit lines BL0, BL2, . . . BLn-1 (not shown) to a node 110, which in turn is connected through the current path of a field effect transistor 114 and a line 115 to the sense amplifier 101. A gate 116 of transistor 114 is connected to a decoded signal Zn. Node 110 is selectively connected to ground through the current path of a field-effect transistor 118, whose gate 120 is connected to a source of a program enable signal $PE_{zn}$.

The sense amplifier 101 compares the signal that it receives on sense line 115 to the signal received on a reference line 122. The reference line 122 is connected to a selected point within a mini-array of (e.g.) 12 read only memory cells. The point in the array to which the reference line 122 is connected is programmable during fabrication such that the state of an operational cell inside the mini-array 124 may be preselected.

The odd transistors 104 through 108 selectively connect their respective bitlines BL1, BL3 . . . BLn to a node 126, which in turn is connected through a current path of an n-channel field effect transistor 121 and a line 128 to the sense amplifier 102. A gate 129 of transistor 121 is connected to a decoded signal Zm. Node 126 is also selectively connected to ground through the current path of a field effect transistor 130, whose gate 131 is connected to a source of a decoded program enable signal $PE_{zm}$. The sense amplifier 102 corresponds to the sense amplifier 101 and compares the signal received on the sense line 128 to a reference value received on a reference line 132 connected to a predetermined point within the miniarray 124.

Figure 3:
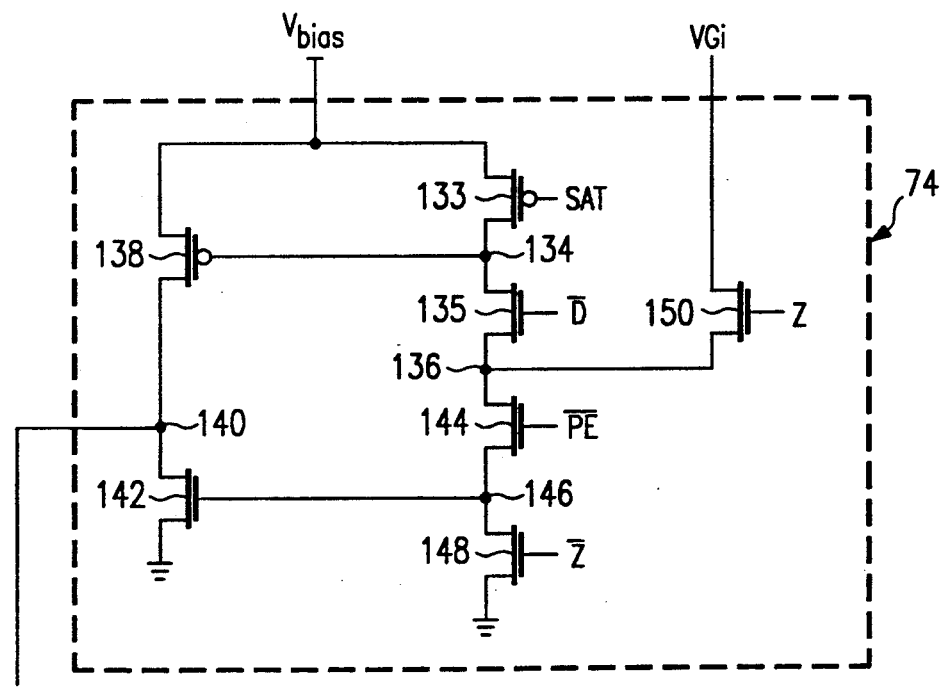
FIG. 3 is a detailed electric circuit diagram of an array source (AS) driver for use with the array shown in FIG. 2.

FIG. 3 illustrates the circuitry of the AS driver circuit 74 in more detail, it being understood that the circuitry shown in FIG. 3 is equally present in each of the AS drivers 72–78. The current path of a p-channel field effect transistor 133 selectively connects a bias voltage source to a node 134. The node 134 is selectively connected through a current path of an n-channel field effect transistor 135 to a node 136. A current path of a p-channel field effect transistor 138 selectively connects $V_{bias}$ to an AS output node 140. Output node 140 is also selectively connected through a current path of an n-channel field effect transistor 142 to ground or $V_{ss}$.

An n-channel field effect transistor 144 has a current path that selectively connects the node 136 to a node 146, which is in turn connected to the gate of the n-channel transistor 142. The node 146 is further selectively connected through a current path of an n-channel transistor 148 to ground.

The gate of p-channel transistor 133 is connected to a signal SAT. The gate of n-channel transistor 135 is connected to signal $\overline{D}$. The gate of the n-channel transistor 144 is connected to the inverse of the program enable signal, $\overline{PE}$. The gate of the n-channel transistor 148 is connected to an inverse decoding signal $\overline{Z}$. The node 136 is selectively connected through the current path of an n-channel field effect transistor 150 to a decoded or virtual ground source VGi, where i can be 1 through n. The gate of transistor 150 is connected to a source of the decoding signal Z.

The $V_{bias}$ signal source is a voltage supply that is maintained more than a p-channel $V_t$ higher than a chip low voltage source $V_{ss}$. Referring to FIG. 3 in conjunction with FIG. 1, the virtual ground signal VGi originates in a corresponding VG decoding section 14. The signals SAT and $\overline{PE}$, Z and $\overline{Z}$ originate in the program control section 24, while Z and $\overline{Z}$ originate in the Z decoder section 25. Signal $\overline{D}$ originates with each I/O buffer.

FIG. 4 is an electrical schematic diagram of a circuit for generating the signal $\overline{D}$. A NAND gate 160 has a $\overline{\text{DATA}}$ input and a PE input which have their origins external to the chip 10. PE, or program enable, is high only when the array 10 is being programmed. An output 162 of the NAND gate 160 is connected to the input of an inverter 164. An output 166 of the inverter 164 is selectively connected through a current path of an n-channel field effect transistor 168 to a $\overline{\text{D}}$ output node 170. An externally generated write enable (WE) signal is applied to the gate of a p-channel field effect transistor 172, as well as to the gate of the transistor 168.

The inverse of the write enable signal, $\overline{\text{WE}}$, is applied to the gate of an n-channel transistor 174. The read bias signal RB is communicated to the $\overline{\text{D}}$ output node 170 either through p-channel transistor 172, in the instance that WE is in the low state, or through the current path of n-channel transistor 174, in the instance that $\overline{\text{WE}}$ is in a high state. Hence, when WE is equal to zero, and therefore $\overline{\text{WE}}$ is equal to one, the RB signal is transmitted to node 170. Otherwise, RB will be isolated from the output node 170.

For the high state of WE, transistor 168 is conductive and hence a signal may be passed from node 166 to the $\overline{\text{D}}$ output node 170. Node 166 will go high only when $\overline{\text{DATA}}$ and PE are high, hence $\overline{\text{D}}$ at node 170 will be high only when PE is high, the latter of which occurs only when the EPROM is being programmed. As noted above, $\overline{\text{D}}$ will take the value of RB when WE is high.

FIG. 5 is an electrical circuit diagram of a circuit, indicated generally at 180, for generating VCCRB. Like the circuit shown in FIG. 4, the VCCRB circuit is situated within program control block 24 on the chip (FIG. 1). An n-channel field effect transistor 182 has a gate connected to the signal RB and a drain connected to a voltage supply Vcc. The source of transistor 182 is connected to a VCCRB output node 184. A p-channel field effect transistor 186 has a gate connected to a signal source for $\overline{\text{PE}}$, the inverse of the PE original. A source of transistor 186 is connected to a programming voltage source $V_{pp}$, and a drain thereof is connected to the VCCRB output node 184. As can be seen, the output node VCCRB may be brought to RB-$V_{tn}$ when RB is high; the value of RB is such that VCCRB will be approximately 0.5 V over a $V_{tp}$ in the read mode. Alternatively, VCCRB may be at substantially a $V_{pp}$ voltage value when $\overline{\text{PE}}$ is low.

FIG. 6 is a schematic electrical circuit diagram of a signal generating circuit, indicated generally at 190, for producing the SAT signal. A p-channel field effect transistor 192 has a gate connected to the write enable signal source WE. A source of the transistor 192 is connected to the VCCRB voltage supply source, which in turn is generated using the signal generation circuit 180 as shown in FIG. 5. A drain of the transistor 192 is connected to a SAT output node 194. This output node is also connected to the drain of an n-channel field effect transistor 196, whose gate is connected to the WE signal source. A source of the transistor 196 is connected to ground. A p-channel field effect transistor 198 has its source connected to the VCCRB voltage supply and its drain connected to the SAT output node 194. The gate of the transistor 198 is also connected to the SAT output node.

When the WE signal is high, the n-channel transistor 196 will be turned on and the p-channel transistor 192 will be turned off. During this condition, the p-channel transistor 198 will hold the SAT signal at VCCRB minus a p-channel $V_t$. In the read mode, this will approximate zero volts, while in the programming mode, this value will approximate $V_{pp}$ minus a p-channel $V_t$. This is because transistor 196 is relatively small in comparison to transistor 198, and therefore, transistor 198 limits the value to which the SAT signal can drop Whenever the SAT signal goes to VCCRB-$V_{tp}$, transistor 133 in FIG. 3 will be turned on. The transistor 133 will be in a high impedance state because its gate does not go to ground. The SAT signal therefore limits the current through transistor 133.

The above FIGS. 2–6 illustrate a preferred embodiment of the invention wherein a selected memory cell is read from one direction, but is programmed from the other direction. In order to understand the programming pattern sensitivity encountered in conventional EEPROM arrays, however, it is useful to study a less complex memory cell array in which each memory cell is read from the same direction with respect to the cell's current path. Such an array is depicted in a schematic electrical diagram in FIG. 7, and is indicated generally at 210 therein The fragment of array 210 shown includes EPROM memory cells 212, 214 and 216. Cells 212–216 have control gates connected to a word line Xi. The current path of transistor 212 is connected between a bit line BL0 and a node AS1. The current path of cell 214 is connected between the node AS1 and a bit line BL1. The current path of the transistor 216 is connected between the bit line BL1 and array source node AS2.

The bit line BL0 is connected to a bias voltage source $V_{bias}$ through an n-channel field effect transistor 218. Likewise, BL1 is connected to $v_{bias}$ through the current path of an n-channel field effect transistor 220. The gates of transistors 218 and 220 are connected in parallel to a voltage supply source $V_{cc}$. The other ends of bit lines BL0 and BL1 terminate at the ends of current paths of respective Y selector transistors 222 and 224. The drains of these transistors are connected to their respective bit lines, while the sources thereof are connected to a node 226 which is selectively connected to a sense amplifier (not shown).

An n-channel field effect transistor 228 has a current path connecting $V_{bias}$ to node AS1. An n-channel field effect transistor 230 has a current path that connects node AS1 to Vss or ground. The gate of transistor 228 is connected to the inverse of a decoded or virtual ground signal $\overline{\text{VG1}}$ while a source of the true signal VG1 is connected to the gate of transistor 230.

In a similar manner, a transistor 232 has a current path connecting $v_{bias}$ to the node AS2, while an n-channel field effect transistor 234 has a current path connecting the AS2 node to $V_{ss}$ or ground. The gate of transistor 232 is connected to the inverse virtual or decoded ground signal $\overline{\text{VG2}}$, while a source of the true VG2 signal is connected to the gate of transistor 234.

The memory cells 212–216, as illustrated in array 210, exhibit a pattern sensitivity when being programmed. That is, a bit's programmability has been found to be an indirect function of the state of a bit sharing a common bit line. As seen from a view point external to the array 210, the bit's program efficiency is a function of the neighboring bit's state.

Consider the programming of transistor 216. Transistor 216 is read by pulling node AS2 low. This in turn is accomplished by turning on transistor 234 and turning off transistor 232, which in turn is actuated by having VG2 be high and its inverse $\overline{\text{VG2}}$ low. If cell 216 is erased, the bit line BL1 will be pulled low because transistor 220 is resistive and cell 214 is resistive. A low level on node BL1 is sensed as a "1". If transistor 216 is programmed, the bit line BL1 goes to $V_{bias}$ and this is sensed as a "0".

Ideally, the current path of the EPROM cell 214 is much more resistive than the voltage supply transistor 220 so that most of the current passing through the current path of transistor 216, or $i_{216}$, is contributed by a current $i_{220}$. In general, AS1, BL0, AS2, BL1, etc. are high-capacitance lines. AS1 is driven to $V_{bias}$ with transistor 228 so that cell 214 will not have to drive node AS1. If the node AS1 were low, cell 214 could be pulling down the bit line BL1 and wrong data could be read at node BL1 until cell 214 charges up AS1.

The cell 214 is much more resistive than $\overline{VG}$ transistor 228. Unfortunately, for performance reasons, the current path of cell 214 is not much more resistive than the $V_{bias}$ supply transistor 220. In some instances, $i_{214}$ can be contributing as much as forty percent of the current $i_{216}$, which is significant. For this reason, the ability of cell 216 to pull down the bit line BL1 to a valid "1" is a function of the resistivity of transistors 214 and 220. If the cell 216 is being programmed to a "0", the amount of charge placed on the cell 216's floating gate that is required to result in a "0" being read becomes a function of the state of the neighboring EPROM cell 214.

In the embodiment illustrated in FIG. 7, all gates connected to the selected word line $X_i$ go to $V_{cc}$. The voltage level as applied to the word line $X_i$ increases, more charge is required to exist on a programmed EPROM cell floating gate in order to maintain a valid zero, that is, in order to keep the current path of the programmed cell non-conductive. This in turn leads to a way to measure the amount of $V_t$ shift resulting from adding negative charge to a floating gate by measuring the $X_i$ voltage at which a "0" is first sensed. In the EPROM cells illustrated in FIGS. 2 and 7, there has been seen at least as much as a 1.3 volt variation in the $X_i$ read voltage in the acquisition of valid zeros, depending on whether a neighboring memory cell showing the same bit line is programmed.

The accepted conventional programming algorithm programs each cell on a row in series. Hence, if transistors 214 and 216 are both to be programmed with zeros, transistor 214 would have a $V_{pp}$ impressed on its control gate and AS1 brought low for a predetermined pulse period. The bit line BL1 is then read to see whether or not sufficient charge was transferred to the floating gate 238 of the cell 214 to render the current path of cell 214 nonconductive. If so, a valid "0" is sensed. If not, another programming pulse is administered to the control gate of the cell 214, and this process is repeated until a valid "0" is sensed.

Figure 8:
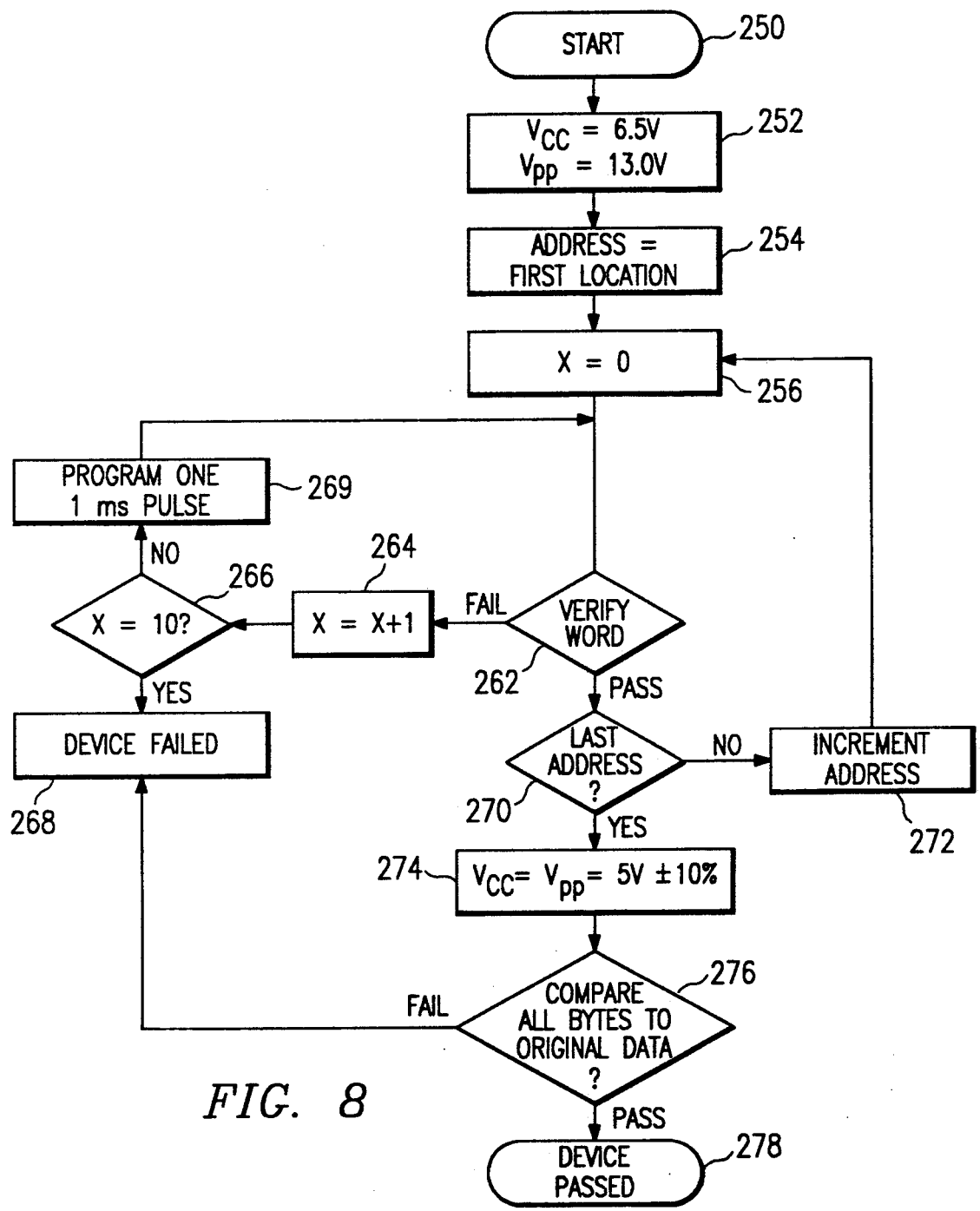
FIG. 8 is a block diagram of a programming and verification procedure to the invention.

FIG. 8 is a flow chart of a programming algorithm common in the industry. The algorithm starts at 250. At step 252, $V_{cc}$ (the read voltage) is set at 6.5 volts and $V_{pp}$, the programming voltage, is set at 13 volts. An address pointer is initially set to a first memory location at step 254. A counter X is set at zero at step 256. At step 262, the contents of one word are verified. If however the cells in the word which are to be programmed to a "0" fail to correctly register a zero, the word fails and the algorithm passes to step 264. X is incremented at this step. At step 266, the counter X is compared to a predetermined number, such as 10, to determine if this number of programming attempts have been made. If X is now equal to 10, a determination is made that the device has failed at step 268. If X is not yet equal to 10 or some other predetermined number, the program proceeds to step 269, which programs the selected cells in the word with a one millisecond pulse. This loop continues until the word passes or until 10 has been reached by the counter X.

At decision point 270, the algorithm asks whether the current address is equal to the last address. If not, the address is incremented at step 272 and the program loops back to step 256, where the counter X is again set to "0" for a next programming cycle. If the last address has been reached, then $V_{pp}$ is set back to five volts plus or minus ten percent at step 274. At step 276, all bytes are compared to the original data to be programmed. It is at this point that pattern sensitivity has been detected in some instances, wherein some cells have been thought to pass a "0" but later have been determined to fail. This will be explained in more detail below. Finally, if all of the bytes of the original data have passed, the device passes at step 278.

Returning to FIG. 7, as has been above described, as much as 40% of the current $i_{216}$, or the current passing through the current path of cell 216, is contributed by $i_{214}$, or the current passing through the current path of cell 214. The remainder of the current is contributed by $i_{220}$ through the current path of the bias voltage transistor 220. If cell 216 is to be programmed as a zero, then the charge on the floating gate 236 of the cell 216 required to produce a zero, will be a function of the state of the floating gate 238 of cell 214.

Transistor 214 will be considered nonconductive where it cannot pass enough current to pull BL1 down. The voltage at node BL1 is replenished by $i_{220}$ from the source $V_{bias}$ and $i_{216}$ (running in a direction opposite from that shown) from the array source AS2. The leakage current through transistor 214 may be higher in the presence of a large $i_{216}$, and the sense amplifier will still "see" a high level at BL1. Therefore, the amount of charge on the floating gate 238 of transistor 214, in order for the sense amplifier to sense a "0" on BL1, need not be as great as if there were no contribution from $i_{216}$.

The conventional programming algorithm as shown in FIG. 8 steps from one cell to the next cell in the same row. Suppose that both transistors 214 and 216 require to be programmed with "zeros". If transistor 216 is programmed with a zero, the current $i_{216}$ will decrease. Therefore, in reading cell 214, the voltage on BL1 will not be replenished sufficiently by $i_{216}$, and $i_{220}$ will not be able to keep up with the leakage current through the current path of transistor 214. The voltage on BL1 will be drained off to a low state. The sense amplifier, when reading BL1, will sense a "1", which is error.

One solution to this pattern sensitivity problem is to program each cell that is to receive a "0" state with one pulse. This significantly increases the resistance of the current path of the cells so programmed, such that there will not be as significant a current contribution from a neighboring, zero-programmed cell as there was in the conventional algorithm. After all zero-programmed cells have received one pulse, the program loops back and programs each "zero" cell with a remaining number of pulses to bring the charge up on that cell's floating gate until a "0" is read. However, the conventional algorithm as shown in FIG. 8 has been accepted as an industry standard, and this alternative programming method is therefore not always available as a choice for solving the pattern sensitivity problem.

A solution to this pattern sensitivity problem according to the present invention is to turn off all inverse virtual ground signals for the array as described in FIG.

7. Referring particularly back to FIG. 7, $\overline{VG1}$ and $\overline{VG2}$ are turned off only in the program verify mode, or step 262 in FIG. 8. This isolates AS1, AS2 . . . from the voltage bias source. In determining the state of cell 214, VG1 is turned on, rendering the current path of transistor 230 conductive and connecting AS1 to a ground path. The state of BL1 is then sensed. Because, $\overline{VG2}$ has been turned off, AS2 will no longer be high. The current $i_{216}$ will therefore be negligible and a correct reading at node BL1 will be had.

Because AS2 is no longer high, the node at BL1 will not rise as quickly as it would otherwise. This however is not important in the conventional programming algorithm, because the speed of the algorithm is slower than the time necessary for BL1 to have its voltage rise due to current $i_{220}$ by itself. Since the inverse virtual ground signals are turned off only in the verify mode, this solution does not cause any decrease in read time after the chip has been programmed.

According to the invention, while the inverse virtual ground signals are all turned off, the true virtual ground signals, VG1, VG2 . . . are still independently selectable, such that a selected one of the virtual ground signals is turned on while the rest are turned off.

Referring again to FIG. 2, suppose that cells 36 and 38 within this portion of the array are to be both programmed with "zeros". Cell 36 will be programmed before cell 38. The above-described pattern sensitivity would still occur, as a significant contribution to the verify current for cell 36 would come from cell 38, and the voltage at node BL2 might be incorrectly sensed as being high. Therefore, the state of cell 36 would be incorrectly sensed as a "0" with an insufficient amount of charge having been transferred to its floating gate. Applying the invention, the solution is to decrease the contribution of $i_{38}$. The AS Driver$_2$ circuit 76 should isolate $V_{bias}$ from the AS2 driver node 84 to render $i_{38}$ negligible. Referring again to FIG. 3, this is accomplished in the preferred embodiment as follows.

In a read mode, signal $\overline{D}$ is at the level of RB ($=VCCRB+V_{tn}$) and therefore, turns on transistor 135. Signal Z, a decoded signal, is on in both read and verify states. The inverse program enable signal $\overline{PE}$ is also high in both read and verify states, while signal $\overline{Z}$ is low in both of these states. The signal SAT is at VCCRB in a read state, while the signal SAT is in a nonzero, impedance-reducing state in the verify mode.

Since, in the verify mode, transistor 135 is off and the impedance of transistor 133 has been reduced, the voltage level at node 134 causes p-channel transistor 138 to be rendered nonconductive. Node 140 therefore is not a source of current for the array source node or the current path of the nonselected cell associated with it.

In the read mode, however, SAT is set to VCCRB and signal $\overline{D}$ is set to RB. This brings node 134 low and renders transistor 138 conductive. The array source node 140 will therefore be coupled to $V_{bias}$, and a source of current will be available to speed the read operation.

FIGS. 4–6 are signal generating circuits which together partially comprise a circuit for sensing the presence of a read or a verify state, among other states. In both the read and verify states, the program enable signal PE is low while its inverse is high. The $\overline{D}$ signal is set at RB, a nonzero voltage bias source, while in the verify state, the signal is low. RB is in both read and verify states equivalent to $V_{bias}+V_t$. In the read mode, the signal WE is low, while in the verify state, WE is high, and the reverse states are true for its inverse, $\overline{WE}$. The receipt of the $\overline{DATA}$ and WE signals by the circuitry shown in FIGS. 4 and 6 allow the differentiation of read and program verify states.

In summary, methods and apparatus have been shown and described for preventing errors in the verification of the "0" programming of electrically programmable read only memory cells. The present invention eliminates the above-described pattern sensitivity while at the same time conforming to the accepted industry standard programming algorithm.

While illustrated embodiments and their advantages have been described in the above detailed description, the invention is not limited thereto but only by the spirit and scope of the appended claims.

What is claimed is:

1. Apparatus for verifying the state of a plurality of electrically programmable memory cells, comprising:
   first and second memory cells, current paths of each of said cells having first and second ends, a memory cell state sense node coupled to said first ends;
   a first array source node coupled to said second end of said current path of said first cell;
   a second array source node coupled to said second end of said current path of said second cell;
   first circuitry for receiving at least one input signal and sensing a program verify state in response;
   decoded ground circuitry coupled to said first circuitry, and for selectively coupling a selected one of said first and second array source noes to a low voltage source providing a low voltage level in response to said first circuitry sensing a program verify state;
   a voltage bias source selectively coupled to said first and second array source nodes for providing a voltage level substantially different from said low voltage level; and
   second circuitry coupled to said first circuitry and said first and second array source nodes for selectively isolating at least a nonselected one of said first and second array source nodes from said voltage bias source in response to said first circuitry sensing a program verify state.

2. The apparatus of claim 1, wherein said first circuitry is operable to sense a read state different from said program verify state, said second circuitry coupling at least a nonselected one of said first and second array source nodes to said voltage bias source in response to said first circuitry sensing a read state.

3. The apparatus of claim 1, wherein said second circuitry is operable to isolate all of said array source nodes from said voltage bias source in response to said first circuitry sensing a program verify state.

4. The apparatus of claim 1, wherein said first and second memory cells each comprise an electrically programmable read only memory cell including a floating gate, a predetermined charge selectively impressed on said floating gates to render the current path of a respective cell nonconductive.

5. The apparatus of claim 1, and further comprising a voltage bias source coupled to said memory cell state sense node for providing a high voltage level to be sensed thereon in the instance that a selected cell has a zero state.

6. The apparatus of claim 1, wherein said decoded ground circuitry comprises a transistor having a current path and a control electrode, said current path of said transistor selectively coupling one of said first and second array source nodes to a low voltage source having a voltage level less than said voltage bias source, a decoded ground signal selectively coupled to said control electrode of said transistor for rendering said current path conductive.

7. The apparatus of claim 1, wherein said second circuitry comprises a transistor having a current path and a control electrode, said current path selectively coupling said nonselected one of said first and second array source nodes to a voltage bias source, said control electrode of said transistor having a voltage level impressed thereon during a program verify state sufficient to render said current path nonconductive.

8. The apparatus of claim 7, wherein said transistor comprises a first p-channel field-effect transistor, said second circuitry further comprising a second p-channel field effect transistor having a current path for selectively coupling said voltage bias source to the control electrode of said first p-channel field effect transistor, a saturation signal having a low state and a high state, a gate of said second p-channel field effect transistor coupled to receive said saturation signal, a low state of said saturation signal reducing the resistance of the current path of said second p-channel field effect transistor to couple the control electrode of said first p-channel field effect transistor to said voltage bias source.

9. The apparatus of claim 1, wherein said decoded ground circuitry comprises an n-channel field effect transistor having a current path selectively coupling said selected one of said first and second array source nodes to said low voltage source, a gate of said n-channel field effect transistor for receiving a first decoded ground signal, a second n-channel field effect transistor of said decoded ground circuitry having a current path for selectively coupling said decoded ground signal to said gate of said n-channel field-effect transistor, a gate of said second transistor coupled to a decoding signal, a third n-channel field-effect transistor having a current path for coupling said gate of said n-channel transistor to said low voltage source, a gate of said third transistor coupled to an inverse of said decoding signal.

10. An array of electrically programmable memory cells, comprising:
a plurality of memory cells arranged in columns;
for each of a plurality of pairs of columns, a bit line electrically disposed therebetween, first ends of current paths of cells in each said pair of columns coupled to said bit line;
for each of a plurality of pairs of columns, an array source line electrically disposed therebetween, second ends of said current paths opposite said first ends of cells in each last said pair of columns coupled to said array source line;
mode sensing circuitry for sensing a program verify mode in response to the receipt of at least one input signal;
a plurality of array source driver circuits having outputs coupled to respective ones of said array source lines, each array source driver circuit coupled to said mode sensing circuitry, a voltage bias source and a low voltage source having a voltage level substantially different from the level of said voltage bias source, a selected one of said array source driver circuits coupling said low voltage source to a respective array source line in response to said mode sensing circuitry sensing a program verify mode, at least non-selected ones of said array source driver circuits isolating said voltage bias source from respective array source lines in response to said mode sensing circuitry sensing a program verify mode.

11. The array of claim 10, wherein said mode sensing circuitry is further operable to sense a read mode different from said program verify mode, said nonselected ones of said array source driver circuits coupling said voltage bias source to respective array source lines in response to said mode sensing circuitry sensing a read mode.

12. The array of claim 10, wherein each of said array source driver circuits is operable to isolate said voltage bias source from respective array source lines in response to said mode sensing circuitry sensing a program verify mode.

13. The array of claim 10, wherein each of said memory cells is an electrically programmable read only memory cell, a floating gate of each said cell operable to have a predetermined charge programmed thereon, a control gate for impressing a predetermined read voltage thereon, said predetermined charge as programmed onto said floating gate rendering a said current path of a respective cell relatively nonconductive upon the impression of a said predetermined read voltage on said control gate.

14. The array of claim 10, and further comprising a plurality of bias transistors, current paths of said bias transistors selectively coupling respective ones of said bit lines to a voltage bias source, a sense amplifier selectively coupled to each said bit line for reading a voltage level thereon, the voltage level of a selected bit line depending on the state of a selected memory cell to be read, a high voltage level on said selected bit line resulting from current from said bias transistor and current from a neighboring, nonselected cell.

15. The array of claim 10, wherein each of said array source driver circuits includes a transistor having a current path for selectively connecting said respective array source line to said low voltage source, a control electrode of said transistor coupled to a source of a decoded ground signal.

16. The array of claim 10, wherein each of said source driver circuits comprises a first p-channel field effect transistor having a current path for coupling said voltage bias source to said respective array source line and a gate, a second p-channel field effect transistor having a current path for selectively coupling said voltage bias source to said gate of said first transistor, a gate of said second transistor coupled to a saturation signal, the voltage level of the saturation signal affecting the conductance of the current path thereof.

17. The array of claim 10, wherein each said array source driver circuit selectively operates in one of a read mode and said program verify mode and comprises an n-channel field effect transistor having a current path for selectively coupling said respective array source line to said voltage bias source, an inverse decoded ground signal coupled to a control electrode of said n-channel field effect transistor when said array source driver circuit operates in said read mode, a signal rendering said n-channel field effect transistor non-conductive coupled to the control electrode of said n-channel field effect transistor in said program verify mode.

18. A method for verifying the state of an electrically programmable cell, first ends of current paths of first and second memory cells coupled to a bit line, second ends of the current paths of said first and second memory cells coupled to first and second array source nodes, each cell being read by sensing the state of the bit line while the array source node coupled to the second end of the current path of the cell is pulled to a low voltage level provided by a low voltage source substantially different from a bias voltage level provided by a voltage bias source, the method comprising:

sensing a program verify state;

responsive to said step of sensing, coupling a selected one of first and second array source nodes to a source of the low voltage level; and responsive to said step of sensing, isolating at least a nonselected one of the first and second array source nodes from the voltage bias source.

19. The method of claim 18, and further comprising the steps of:

sensing a read state different from the program verify state; and responsive to said step of sensing the read state, coupling at least the nonselected one of the first and second array source nodes to the voltage bias source.

20. The method of claim 18, and further comprising the step of isolating all of the array source nodes from the voltage bias source in response to said step of sensing a program verify state.

21. The method of claim 18, and further comprising the steps of:

determining that a selected one of the first and second memory cells is to be programmed to a "zero" state;

impressing a programming voltage for a predetermined time on a control gate of the selected cell in order to cause an incremental amount of charge to exist on a floating gate of the selected cell;

after said step of isolating, impressing a read voltage on the control gate of the selected cell;

sensing the voltage level of the bit line;

determining whether the voltage level of the bit line is at a sufficiently high voltage level; and repeating said steps of programming, isolating, impressing a read voltage and sensing the voltage level of the bit line until sufficient charge has built up on the floating gate of the selected memory cell that at least a predetermined voltage level on the bit line is achieved.

22. A method for programming an array of electrically programmable read only memory cells, the cells disposed in a plurality of pairs of columns each having a bit line therebetween, first ends of current paths of cells in each said column pair coupled to said respective bit line, a plurality of pairs of columns of the cells each having an array source line electrically disposed therebetween, for each of the last said pairs of columns, second ends of current paths of the cells opposed to said first ends coupled to said array source line such that each current path is electrically disposed between a bit line and an array source line, the method comprising:

if a selected memory cell is to be programmed to a "zero" state, addressing a selected memory cell;

applying a programming pulse to a control gate of the addressed memory cell in order to cause a predetermined incremental amount of charge to reside on a floating gate of the cell;

isolating at least nonselected ones of the array source lines from a voltage bias source;

after said step of isolating, coupling a selected array source line adjacent the addressed cell to a low voltage source having a voltage level substantially different from the voltage bias source;

sensing the voltage level of the bit line adjacent the selected memory cell;

determining whether the voltage level of the selected bit line is at least as high as a predetermined voltage level;

repeating said steps of applying a programming pulse, isolating, sensing and determining until a sufficiently high voltage level on the selected bit line is achieved; and selecting a next memory cell.

23. A non-volatile memory, comprising:

first and second memory cells, current paths of said memory cells having first and second ends, said first end of said current path of said first cell coupled to said first end of said current path of said second cell;

driver circuitry for selectively coupling said second end of said current path of said first cell to a first voltage source providing a first voltage level;

decoded ground circuitry for selectively coupling said second end of said current path of said second cell to a second voltage source providing a second voltage level substantially different from said first voltage level;

a third voltage source coupled to said first ends of said current paths of said first and second cells;

sensing circuitry coupled to said driver circuitry and said decoded ground circuitry for receiving at least one input signal and sensing a program verify state in response; and said driver circuitry operable to isolate said current path of said first memory cell from said first voltage source, such that substantially no current flows between said first voltage source and said second voltage source and said decoded ground circuitry operable to couple said current path of said second memory cell to said second voltage source, both responsive to said sensing circuitry sensing said program verify state.

24. The apparatus of claim 1, wherein said first circuitry senses said program verify state in response to a plurality of signals including said input signal.

25. The array of claim 10, wherein said mode sensing circuitry senses said program verify state in response to a plurality of signals including said input signal.

26. A memory, comprising:

first and second memory cells, current paths of said memory cells having first and second ends, said first ends coupled to a first bit line, said second end of said first memory cell coupled to a first array source line, said second end of said second memory cell coupled to a second array source line;

array source driver circuitry selectively operating in a program verify mode to couple a selected one of said first and second array source lines to a first voltage source providing a first voltage level and to isolate at least a non-selected array source line form a second voltage source providing a second voltage level different from said first voltage level.

27. The memory of claim 26, in which said first voltage level is ground and said second voltage level is a positive bias voltage.

28. The memory of claim 26, in which said array source driver circuitry operating in the program verify mode isolates said selected and non-selected array source lines from said second voltage source.

29. The memory of claim 26, in which said array source driver circuitry operating in the program verify mode isolates said selected array source line from said second voltage source and isolates said non-selected array source line from said first voltage source and said second voltage source.

30. The memory of claim 26, in which said array source driver circuitry selectively operates in a read mode to couple a selected array source line to the first voltage source and to couple a non-selected array source line to the second voltage source.

31. The memory of claim 30, in which said array source driver circuitry operating in the read mode isolates the selected array source line from the second voltage source and isolates the nonselected array source line from the first voltage source.

32. The memory of claim 26, in which said array source driver circuitry includes a first array source driver circuit coupled to said first array source line and a second array source driver circuit coupled to said second array source line.

33. The memory of claim 32, in which each of said first and second array source driver circuits includes a first transistor having a current path coupled between an associated array source line and said first voltage source and a second transistor having a current path coupled between an associated array source line and said second voltage source.

34. The memory of claim 33, in which a control electrode of said first transistor is coupled to a decoded ground signal, said decoded ground signal having a first state when an associated array source line is selected and a second state when an associated array source line is non-selected, said first transistor being conductive when said decoded ground signal is in said first state and nonconductive when said decoded ground signal is in said second state.

35. The memory of claim 34, in which each of said first and second array source driver circuits includes a third transistor and a fourth transistor, said third transistor having a current path coupled between said second voltage source and a control electrode of said second transistor, said fourth transistor having a current path coupled between said control electrode of said second transistor and said decoded ground signal, said third transistor being non-conductive and said fourth transistor being conductive in said read mode to couple said decoded ground signal to the control electrode of said second transistor and said third transistor being in an impedance reduced state and said fourth transistor being non-conductive in said program verify mode to render said second transistor conductive.

36. The memory of claim 34, in which a control electrode of said second transistor is coupled to the inverse of the decoded ground signal when said array source driver circuit operates in said read mode and is coupled to a signal rendering said second transistor non-conductive when said array source driver circuit operates in said program verify mode.

37. The memory of claim 26, further comprising bias circuitry for coupling said bit line to said second voltage source in said verify mode and said read mode.

* * * * *